United States Patent
Kim et al.

(10) Patent No.: US 10,231,363 B2
(45) Date of Patent: Mar. 12, 2019

(54) MODULAR COOLING APPARATUS FOR HIGH-VOLTAGE DIRECT-CURRENT TRANSMISSION SYSTEM

(71) Applicant: HYOSUNG HEAVY INDUSTRIES CORPORATION, Seoul (KR)

(72) Inventors: June-Sung Kim, Anyang-si (KR); Hong-Ju Jung, Seoul (KR); Jong-Yun Choi, Hwaseong-si (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 114 days.

(21) Appl. No.: 15/103,394

(22) PCT Filed: Dec. 24, 2014

(86) PCT No.: PCT/KR2014/012858
§ 371 (c)(1),
(2) Date: Jun. 10, 2016

(87) PCT Pub. No.: WO2015/099469
PCT Pub. Date: Jul. 2, 2015

(65) Prior Publication Data
US 2016/0295737 A1    Oct. 6, 2016

(30) Foreign Application Priority Data
Dec. 26, 2013  (KR) .......................... 10-2013-0163956

(51) Int. Cl.
H05K 7/20          (2006.01)
(52) U.S. Cl.
CPC .......... H05K 7/209 (2013.01); H05K 7/20272 (2013.01); H05K 7/20927 (2013.01)
(58) Field of Classification Search
CPC . H05K 7/209; H05K 7/20272; H05K 7/20927
(Continued)

(56) References Cited

U.S. PATENT DOCUMENTS

| 5,177,667 A | * | 1/1993 | Graham | .............. | H01L 23/4336 257/714 |
| 6,147,867 A | * | 11/2000 | Gaudrel | ................. | H05K 7/209 361/690 |

(Continued)

FOREIGN PATENT DOCUMENTS

| CN | 2867712 Y | 2/2007 |
| CN | 201336793 Y | 10/2009 |

(Continued)

OTHER PUBLICATIONS

English translation of Fujitsu Ltd. JP 06-204674.*
English translation of Guangfu (CN 103036452).*

*Primary Examiner* — Jianying Atkisson
*Assistant Examiner* — Joel Attey
(74) *Attorney, Agent, or Firm* — Novick, Kim & Lee, PLLC; Jae Youn Kim

(57) ABSTRACT

The present invention relates to a modular cooling apparatus for a high-voltage direct-current transmission system. A sub-module (10) according to the present invention comprises a power unit (12) in the front and a capacitor unit (13) in the rear, and a heat sink (30) for discharging heat generated from the interior is provided in an interior space (14') of a power unit housing (14) forming the exterior of the power unit (12). A coolant path (31) is provided in the interior of the heat sink (30). The entrance and exit of the coolant path (31) are located adjacent to the bottom surface of the interior space (14'). Connecting couplers (20) for supplying coolant to the interior space (14') are provided on the sloped surface (16) on the bottom end of the front surface (15) of the power unit housing (14). The sloped surface (16) is formed so as to face the ground at an angle. On both side surfaces of the power unit housing (14) are pass-through parts (22), each of which is provided with a louver plate (24) having louvers (26) to allow air to circulate between the (Continued)

interior space (14') and the outside. As such, according to the present invention, heat is dissipated more effectively while damage to the sub-module (10) due to coolant leakage does not occur.

4 Claims, 6 Drawing Sheets

(58) Field of Classification Search
USPC .................................................. 165/80.4
See application file for complete search history.

(56) References Cited

U.S. PATENT DOCUMENTS

| | | | | |
|---|---|---|---|---|
| 7,258,017 | B1* | 8/2007 | Hedtke | G01L 19/0007 |
| | | | | 73/708 |
| 8,619,425 | B2* | 12/2013 | Campbell | H05K 7/20809 |
| | | | | 165/80.4 |
| 2009/0052134 | A1* | 2/2009 | Casteel | H01L 23/473 |
| | | | | 361/699 |

FOREIGN PATENT DOCUMENTS

| | | | |
|---|---|---|---|
| CN | 103036452 | A | 4/2013 |
| EP | 1484954 | A2 | 12/2004 |
| JP | 06-004179 | A | 1/1994 |
| JP | 06-204674 | A | 7/1994 |
| JP | 2012-084639 | A | 4/2012 |
| KR | 10-0465088 | B1 | 1/2005 |
| WO | 2012/136467 | A2 | 10/2012 |
| WO | 2014/090071 | A1 | 6/2014 |

* cited by examiner

MODULAR COOLING APPARATUS FOR HIGH-VOLTAGE DIRECT-CURRENT TRANSMISSION SYSTEM

TECHNICAL FIELD

The present invention relates to a modular cooling apparatus for a high-voltage direct-current transmission system and, more particularly, to a modular cooling apparatus for a high-voltage direct-transmission system for discharging heat generated in a modular apparatus for a high-voltage direct-current transmission system.

BACKGROUND ART

A High Voltage Direct Current (HVDC) system supplies power by converting AC power from a power plant into DC power, transmitting the DC power, and then inverting the DC power into AC power at a power receiving point. The HVDC system has a loss of power less than an AC transmission type, so it has high power transmission efficiency. Further, the system can improve stability through line separation and has small inductive disturbance, so it is advantageous in long-distance power transmission.

The HVDC system is installed in a structure called a converter module composed of a plurality of submodules stacked 10 meters high in a plurality of layers. The submodules generate a large amount of heat during operation. Accordingly, many studies on structures for discharging heat generated by a submodule to the outside have been conducted. In particular, it is required to separate all components including a cable and a cooling water hose connected to a submodule in order to take down a submodule from a high position for maintenance on the ground.

However, cooling water that leaks while the cooling hose is separated from the submodule may flow into the submodule and may cause leakage of electricity or corrosion. This is because the cooling water hose extends into the submodule through the top of the submodule and water leaking from the cooling water hose can enter the submodule.

Further, the cooling water hose should be separated from the submodule to maintain the submodule, but it cannot, so the submodule should be moved together with the cooling water hose.

Furthermore, since the cooling water hose etc. are positioned over the submodule, it is difficult for a worker to work over the submodule.

DISCLOSURE

Technical Problem

An object of the present invention is to keep a cooling water hose for discharging heat generated from a module in a high-voltage direct-current transmission system under the module and to prevent water from entering the module even if water leaks.

Another object of the present invention is to connect an internal connection pipe and a cooling water hose to each other using a coupler in a module for a high-voltage direct-current transmission system.

Another object of the present invention is to discharge leaking water between a cooling water hose and a coupler to the outside by forming the outer side of a housing, which accommodates the coupler, at a predetermined angle to the gravitational direction.

Another object of the present invention is to make smooth airflow between the outside and the inside of a module for a high-voltage direct-current transmission system.

Technical Solution

According to an aspect of the present invention, there is provided a modular cooling apparatus for a high-voltage direct-current transmission system, the apparatus including: a housing forming an external shape and having an internal space; external couplers disposed through an inclined surface, which is inclined downward at a lower portion of a front of the housing, and connected with cooling water houses; a heat sink disposed in the internal space, having a cooling water channel therein, and mounted with heat sources; and internal couplers disposed at an inlet and an outlet of the cooling water channel and connected to the external couplers through internal connection pipes.

The heat sink may be disposed on an outer side of a support plate erected in the internal space, and the inlet and the outlet of the cooling water channel may be formed at a lower end of the heat sink close to a bottom of the internal space.

The external couplers may have a function of allowing and preventing flow of cooling water flowing therein.

The inclined surface may be formed by cutting off an edge between the front and a bottom of the housing.

A hole may be formed through a side of the housing that faces the heat sink and a louver plate may be disposed over the hole.

The louver plate may have a plurality of louvers so that air flows between the internal space and the outside.

The hole and the louver plate may be applied to both sides of the housing.

Advantageous Effects

It is possible to achieve the following effects from the modular cooling apparatus for a high-voltage direct-current transmission system according to the present invention.

According to the present invention, since the external couplers for connecting the internal pipes and the cooling water hoses in the module to discharge heat using cooling water are disposed at the lower end of the power unit housing that forms the external shape of the module, even if cooling water leaks, the cooling water cannot flow into the module.

Further, since the internal connection pipes and the cooling water hoses are connected by the external couplers in the housing, when the cooling water hoses are separated from the external couplers, the module for a high-voltage direct-current transmission system can be moved, so it is possible to simply maintain the module.

Further, since the external couplers are disposed through the inclined surface at the lower end of the front of the housing, even if water leaks between the external couplers and the cooling water hoses, it cannot flow inside the housing, so damage to the module is prevented.

Further, since holes are formed through the sides of the power unit housing and are covered with louver plates having a plurality of louvers, air can smoothly flow between the internal space and the outside, so heat can be efficiently discharged.

MODE FOR INVENTION

Figure 1:
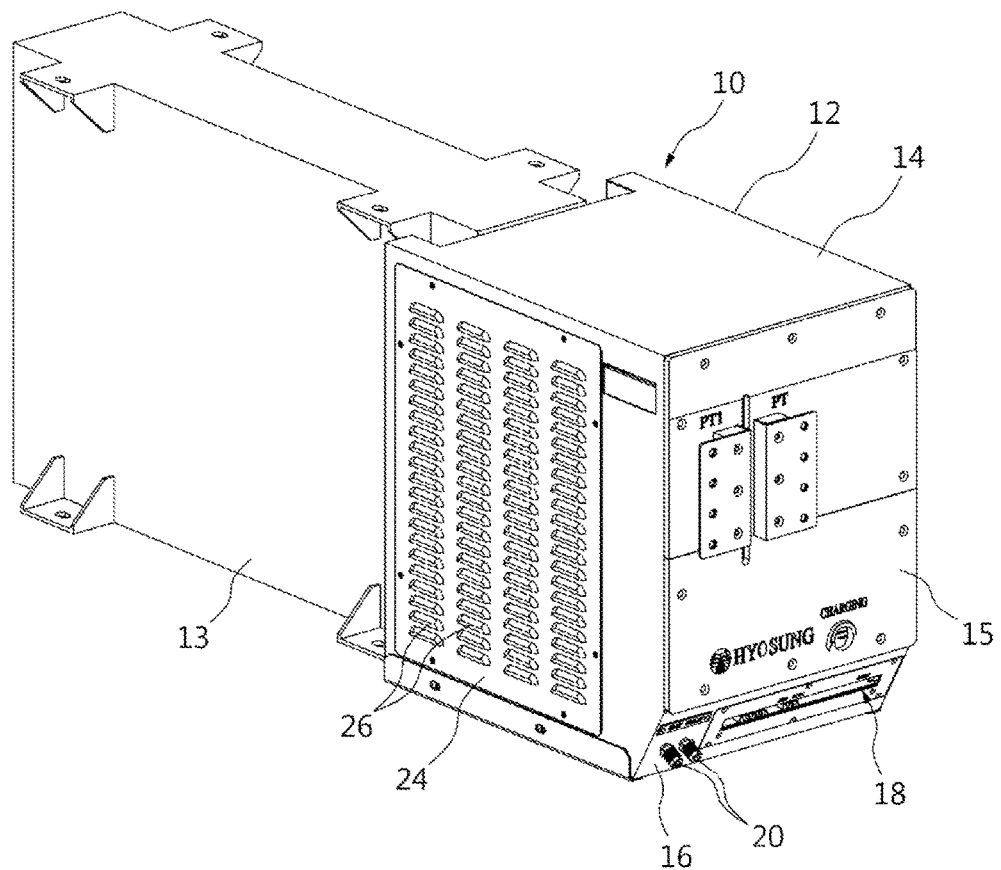
FIG. 1 is a perspective view showing the configuration of a module for a high-voltage direct-current transmission system equipped with a cooling apparatus according to an embodiment of the present invention.
Figure 2:
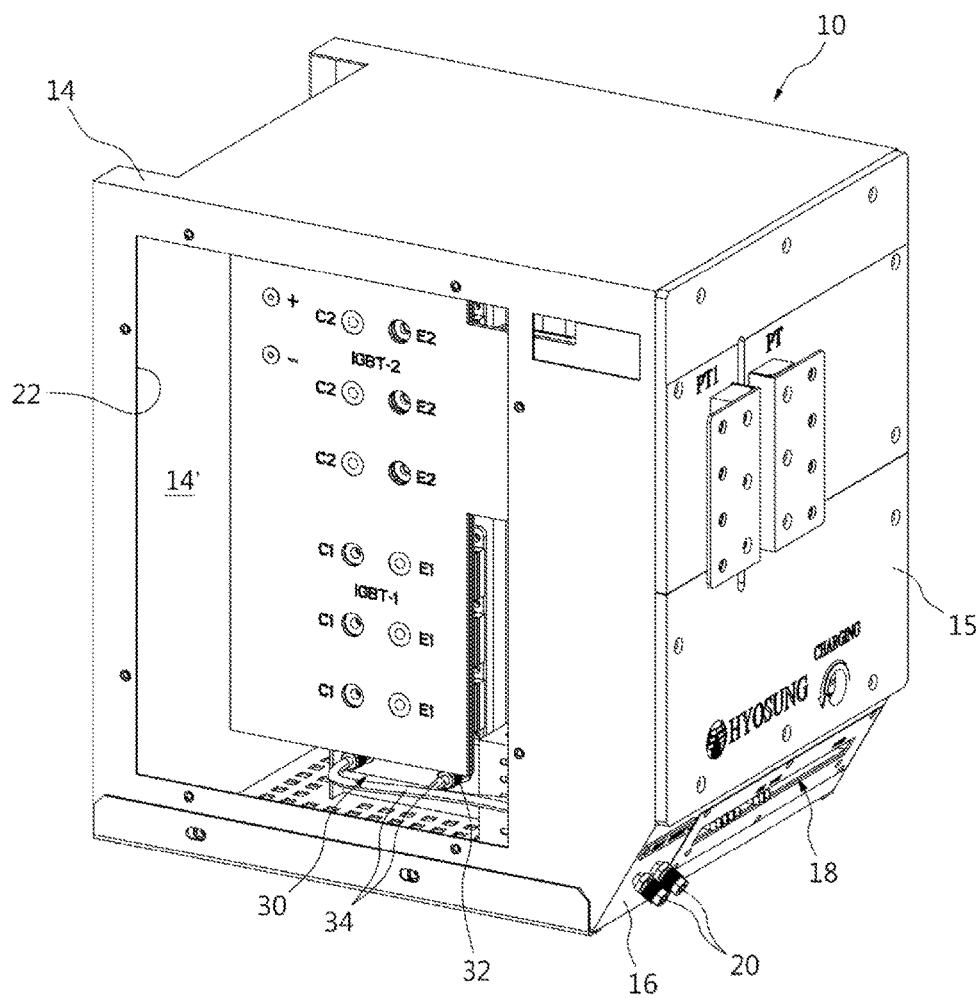
FIG. 2 is a perspective view showing a main configuration of an embodiment of the present invention with a power housing and a louver plate removed.

An embodiment of a modular cooling apparatus for a high-voltage direct-current transmission system according to the present invention is described hereafter in detail with reference to the accompanying drawings. A submodule of modules for a high-voltage direct-current transmission system is exemplified herein.

As shown in the figures, a submodule 10 equipped with a cooling apparatus according to an embodiment is largely composed of a power unit 12 and a capacitor unit 13. Various power semiconductors and various boards are in the power unit 12. A power unit housing 14 forms the external shape of the power unit 12. An internal space 14' is defined in the power unit 12 by the power unit housing 14 and various components of the power unit 12 are disposed in the internal space 14'.

In this embodiment, the power unit housing 14 has a substantially hexahedral shape. The front 15' of the power unit housing 14 is a flat surface with an inclined surface 16 at the lower end. The inclined surface 16 is formed by cutting off the edge between the front 15 and the bottom of the power unit housing 14. The inclined surface 16 faces at an angle the floor where the power unit 12 is located.

A display unit 18 is on the inclined surface 16. The display unit 18 shows the state of the submodule 10. Obviously, signals are connected between the submodule 10 and a controller (not shown) through the display unit 18.

External couplers 20 are disposed at a side on the inclined surface 16. The external couplers 20 are parts where cooling water hoses (not shown) are connected. Two external couplers 20 are arranged in a line on the inclined surface 16, one of which is an inlet for cooling water and other one is an outlet for cooling water that has circulated in the module. The external couplers 20 are disposed through the inclined surface 16 at the lower portion of the front 15 of the power unit housing 14. The external couplers 20 may be opened and closed. In this case, a work has only to remove cooling hoses without cooling water discharged after closing the external couplers.

A hole 22 is formed through a side of the power unit housing 14. The hole 22 communicates the internal space 14' with the outside and is formed in a rectangle in the figures. It is possible to approach and maintain the components in the internal space 14' through the hole 22.

A louver plate 24 is disposed over the hole 22. The hole 22 is covered with the louver plate 24. A plurality of louvers 26 is formed in rows through the louver plate 24. Air can flow between the internal space 14' and the outside through the louvers 26. The hole 22 and the louver plate 24 may be applied to the opposite side of the power unit housing 14.

Figure 3:
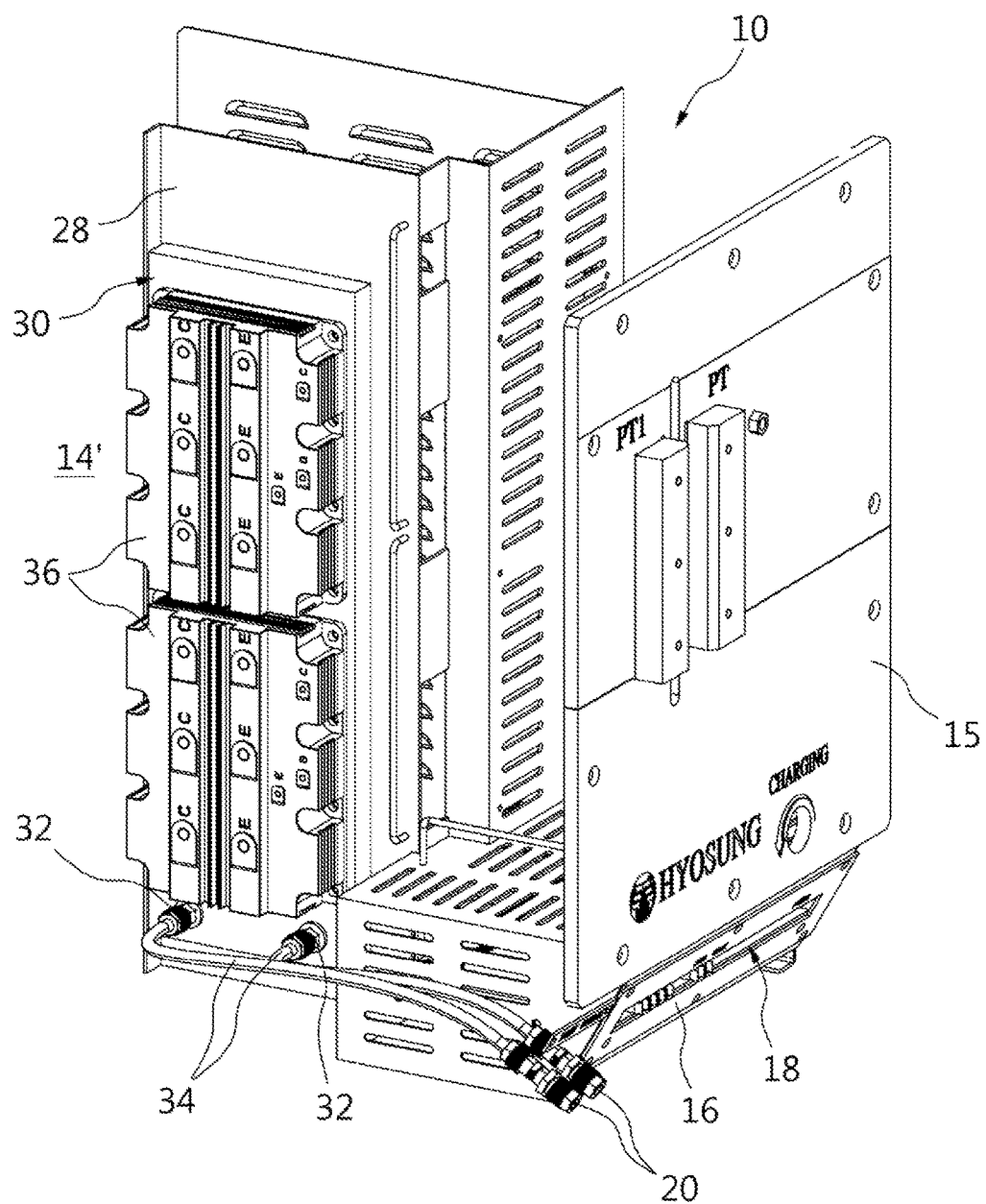
FIG. 3 is a perspective view showing a heat sink according to an embodiment of the present invention on a support plate in an internal space.
Figure 4:
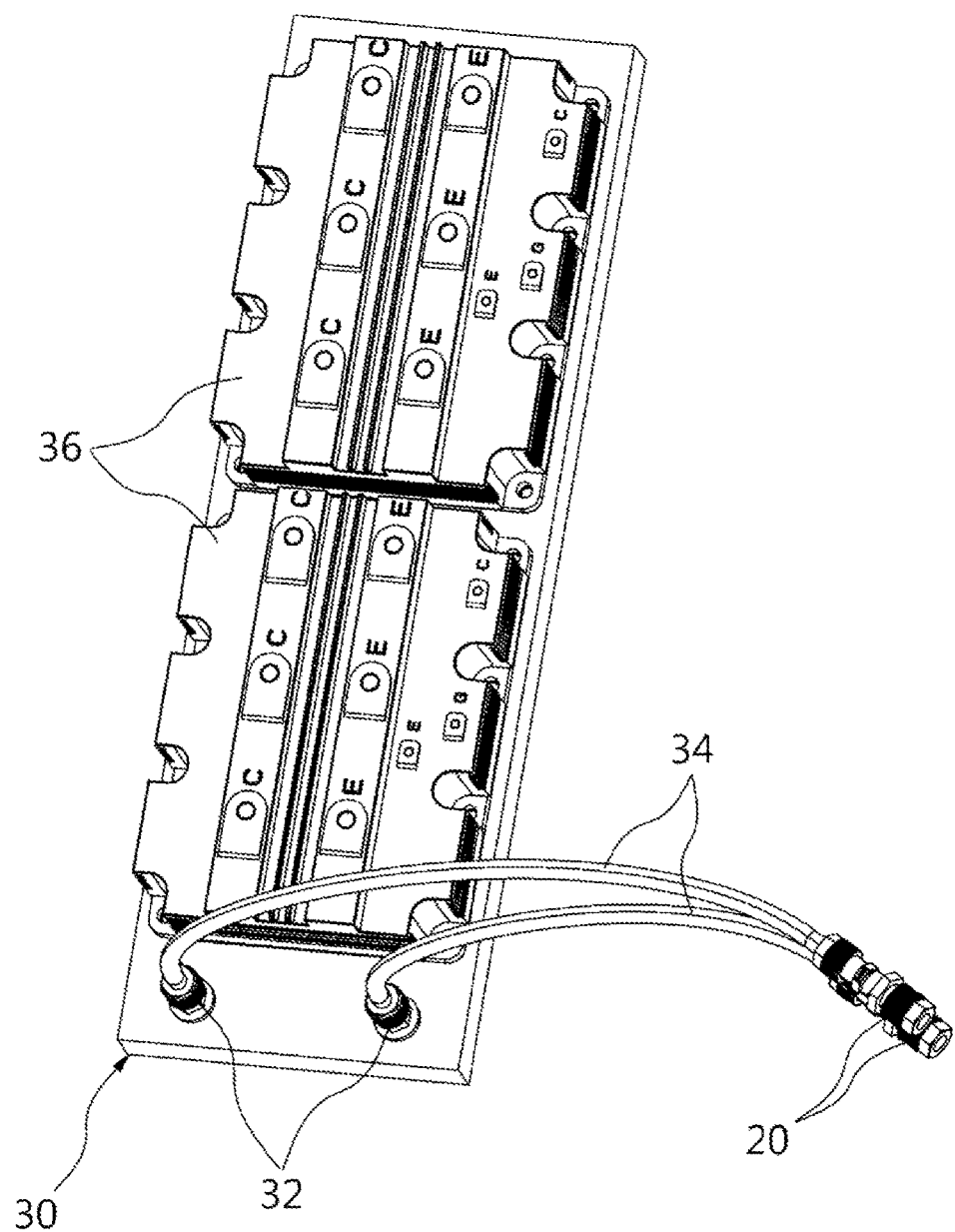
FIG. 4 is a perspective view showing the configuration of an embodiment of the present invention.

A support plate 28 is erected in the internal space 14', as shown in FIG. 3. The support plate 28 is disposed in the space defined by the power unit housing 14. The separation plate 28 divides the internal space 14' into desired spaces and is where a heat sink 30 to be described below is mounted.

The heat sink 30 is mounted on the support plate 28. The heat sink 30 is made of metal having a high heat transfer rate. For example, the heat sink 30 may be made of aluminum.

Figure 5:
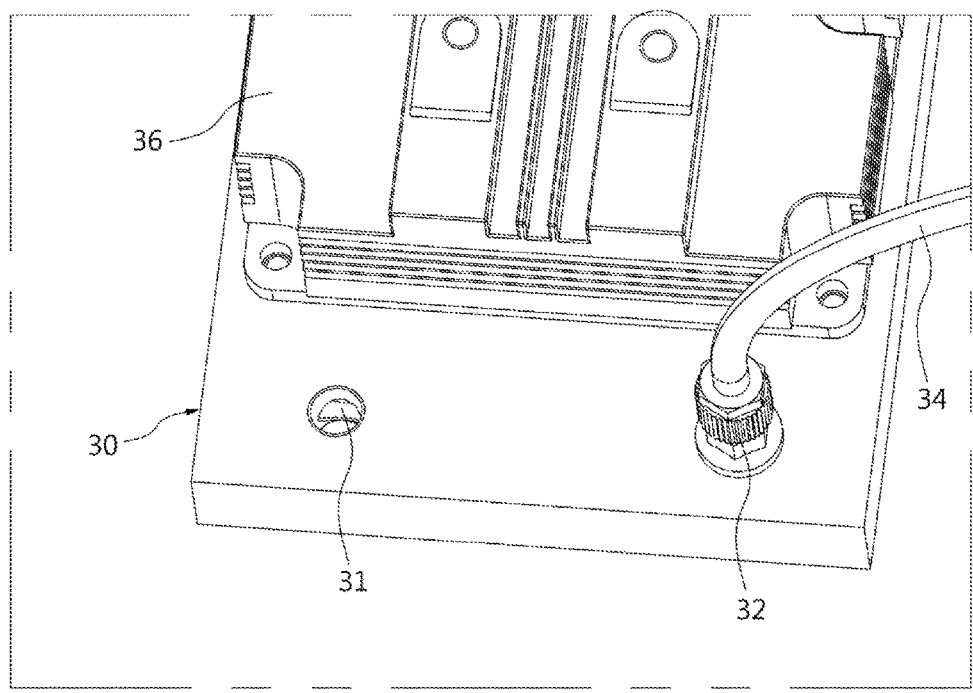
FIG. 5 is an enlarged perspective view showing a main part of the heat sink according to an embodiment of the present invention.

A cooling water channel 31 is formed in the heat sink 30, as shown in FIG. 5. The cooling water channel 31 is formed along several paths in the heat sink 30. The cooling water channel 31 is formed particularly in an area where heat sources 36 to be described below are mounted. The inlet and outlet of the cooling water channel 31 are exposed out of the heat sink 30 and are formed at the lowest portion in the gravitational direction in the heat sink 30. That is, the inlet and the outlet of the cooling water channel 31 are formed at the lower portion of the heat sink 30 close to the bottom of the internal space 14'. This is for preventing water leaking through the inlet and the outlet, that is, water leaking from internal couplers 32 (described below) at the inlet and the outlet from flowing to other components.

The internal couplers 32 are disposed at the inlet and the outlet of the cooling water channel 31. The internal couplers 32 are disposed respectively at the inlet and the outlet of the cooling water channel 31 of the heat sink 30. The internal connection pipes 34 connect the internal couplers 32 and the external couplers 20. The internal connection pipes 34 delivers cooling water from the internal space 14' to the heat sink 30 and delivers the cooling water coming out after flowing in the heat sink 30 to the cooling water hose through the internal coupler 20. The internal connection pipes 34 may be made of a soft material or metal.

The heat sink 30 is attached to the support plate 28 and the heat sink 30 is vertically erected, so the heat sink 30 is also vertically erected. The heat sources 36 are attached to the heat sink 30. Various devices, such as an IGBT, may be used for the heat sources 36.

Figure 6:
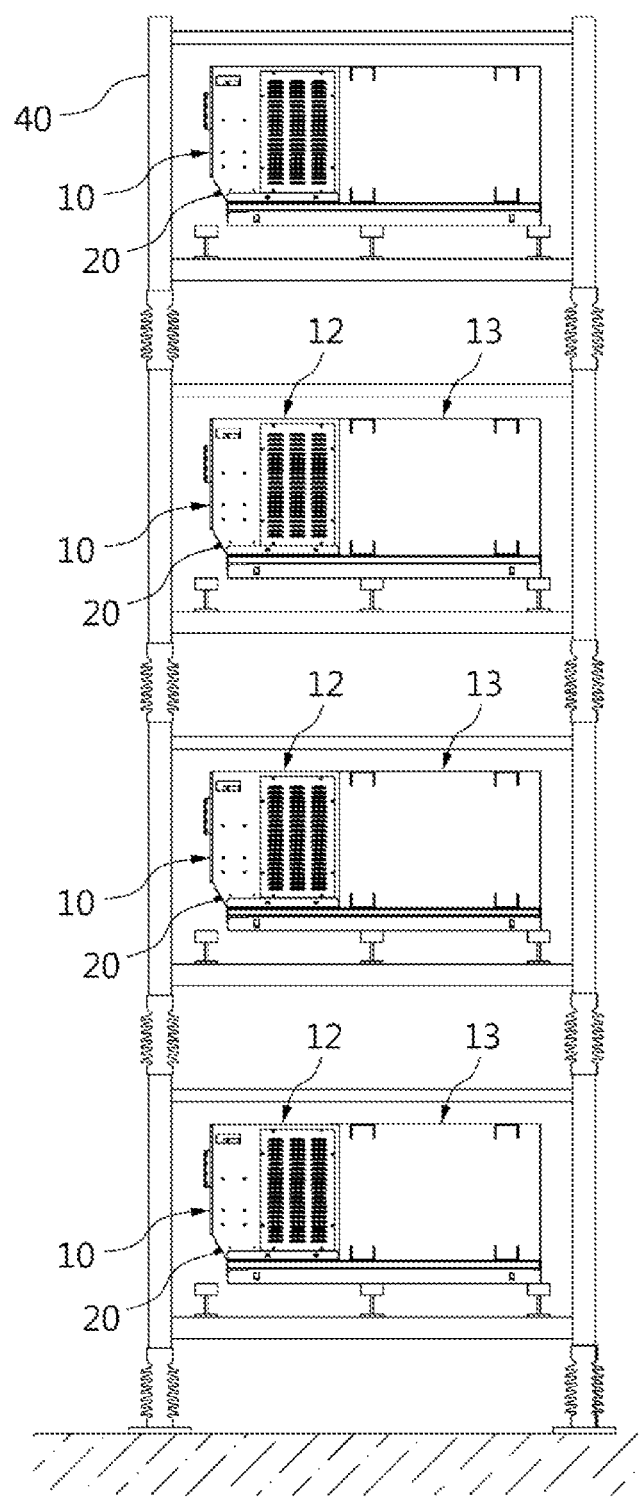
FIG. 6 is a view showing use of a submodule for a high-voltage direct-current transmission system according to an embodiment of the present invention in a structure.

The submodule 10 according to an embodiment of the present invention is installed in a high-rise structure 40, as shown in FIG. 6. The structure 40 is about 10m high and has a plurality of floors, and the submodule 10 is installed on each floor. The submodule 10 is installed and used on each floor of the structure 40.

Use of the modular cooling apparatus for a high-voltage direct-current transmission system according to the present invention having the configuration described above is described in detail hereafter.

The submodule 10 is installed and used on each floor of the structure 40, as shown in FIG. 6. The power units 12 of the submodules 10 are connected to a controller on the ground where the structure 40 is constructed through cables. Control signals from the controller are transmitted to the control boards in the power units 12 of the submodules 10 through the cables. The control signals transmitted to the control board are transmitted to the components in the power units 12, thereby operating the submodules 10. The operational states of the submodules 10 or the operational states of the components in the submodules 10 are shown by the display units 18.

The heat sources 36 generate a large amount of heat while the submodule 10 operates. Cooling water is supplied to remove the heat and transmits the heat to the outside while flowing through the cooling water channel 31 in the heat sink 30.

That is, cooling water hoses are connected to the external couplers 20 to supply cooling water to the power unit 12 through one of the external couplers 20. Cooling water is supplied to the internal connection pipe 34 through the external coupler 20 and the cooling water passing through the internal connection pipe 34 flows into the cooling water channel 31 through the internal coupler 32 at the inlet of the cooling water channel 31.

The cooling water flowing in the cooling water channel 31 takes the heat transmitted to the heat sink 30 from the heat sources 35 and the heat is transmitted to the internal connection pipe 34 through the internal coupler 32 at the outlet of the cooling water channel 32 while the cooling water circulates through the cooling water channel 31. The cooling water flows through the internal connection pipe 34 connected to the internal coupler 32 at the outlet of the cooling water channel 31, flows to the cooling water hose through the external coupler 20, and is then discharged out of the power unit 12. The cooling water flowing in the cooling water hose flows to another cooling structure in the structure 40 and discharges the heat to the outside. The cooling water that has discharged heat in the cooling structure can discharge heat again through the path described above.

The submodules 10 need to be maintained. In order to take the submodule 10 out of the structure 40 and work with submodule 10 on the ground, it is required to separate the cable connected to the display unit 18 and the cooling water hoses connected to the external couplers 20.

The cooling water hoses can be separated from the external couplers 20 after fully discharging the cooling water out of the submodule 10. Obviously, when the external couplers 20 can be opened and closed, the cooling water hoses can be separated from the external couplers 20 with all the two external couplers 20 closed. Accordingly, it is possible to take out the submodule from the structure 40 for repairs.

Portions where cooling water may leak from the submodule 10 are the inlet and outlet of the cooling water channel 31 of the heat sink 30, the internal couplers 34 at the inlet and outlet, and the external couplers 20 protruding through the inclined surface 16 on the front 15 of the power unit housing 14.

The inlet and outlet of the cooling water channel 31 of the heat sink 30 and the internal couplers 34 are all disposed close to the bottom of the internal space 14'. Accordingly, even if cooling water leaks at those places, the cooling water has little influence on other components in the internal space 14'.

Further, the external couplers 20 are also disposed at the lower portion of the front 15, so even if there is leaking water, the leaking water does not cause a problem with other components. In particular, when water leaks at the portions where the external couplers 20 protrude out of the power unit housing 14, the water drops at the inclined ends of the external couplers 20, but it drops away from the power unit housing 14, so it does not cause a problem with the submodule 10.

For reference, the internal connection pipes 34 are connected to the ends of the external couplers 20 in the internal space 14', the external couplers 20 and the internal connection pipes 34 are not separated once they are connected, and even if water leaks at these portions, it drops to the bottom of the internal space 14', so there is no problem.

Further, the cooling hoses are connected/disconnected to/from the portions of the external couplers 20 protruding out of the power unit housing 14, so water may leak at these portions. However, the leaking water at these portions is fully sent to the outside of the power unit housing 14, so it does not influence the submodule 10.

Further, the hole 22 formed through a side of the power unit housing 14 allows a worker to easily access the components, for example, the heat sink 30 in the internal space 14', so heat in the internal space 14' is discharged to the outside while air flows between the outside and the internal space 14'. To this end, the louver plate 24 having a plurality of louvers 26 is disposed over the hole 22.

The above description is an example that explains the spirit of the present invention and may be changed and modified in various ways without departing from the basic features of the present invention by those skilled in the art. Accordingly, the embodiment described herein are provided not to limit, but to explain the spirit of the present invention and the spirit and the scope of the present invention are not limited by the embodiments. The protective range of the present disclosure should be construed on the basis of claims and all the technical spirits in the equivalent range should be construed as being included in the scope of the right of the present disclosure.

The invention claimed is:

1. A modular cooling apparatus for a high-voltage direct-current transmission system, the apparatus comprising:
   a housing forming an external shape and having an internal space;
   external couplers disposed through an inclined surface, which is inclined downward at a lower portion of a front of the housing, and configured to be connected with cooling water hoses;
   a heat sink disposed in the internal space, and having a cooling water channel disposed therein, wherein one or more heat sources are mounted on an external surface of the heat sink and the cooling water channel is disposed adjacent to the one or more heat sources; and
   internal couplers respectively disposed at an inlet and an outlet of the cooling water channel and respectively connected to the external couplers through respective internal connection pipes,
   wherein the inclined surface is disposed between and respectively connected with the front and a bottom of the housings,
   wherein the heat sink is disposed on an outer side of a support plate erected in the internal space, and the inlet and the outlet of the cooling water channel are formed at a lower end of the heat sink adjacent to a bottom of the internal space, and
   wherein a hole is formed through a side of the housing that faces the heat sink and a louver plate is disposed over the hole.

2. The apparatus of claim 1, wherein the external couplers have a function of allowing and preventing flow of cooling water flowing therein.

3. The apparatus of claim 1, wherein the louver plate has a plurality of louvers so that air flows between the internal space and an outside of the housing.

4. The apparatus of claim 3, wherein the hole and the louver plate are applied to both sides of the housing.

* * * * *